United States Patent
Park et al.

(10) Patent No.: US 10,410,701 B2
(45) Date of Patent: Sep. 10, 2019

(54) CLOCK MONITORING CIRCUIT

(71) Applicant: SK hynix Inc., Gyeonggi-do (KR)

(72) Inventors: Myeong-Jae Park, Gyeonggi-do (KR); Young-Jae Choi, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/159,930

(22) Filed: Oct. 15, 2018

(65) Prior Publication Data

US 2019/0198072 A1 Jun. 27, 2019

(30) Foreign Application Priority Data

Dec. 26, 2017 (KR) .................. 10-2017-0179850

(51) Int. Cl.
| | |
|---|---|
| *G06F 1/08* | (2006.01) |
| *G11C 7/22* | (2006.01) |
| *G06F 1/14* | (2006.01) |
| *G06F 1/12* | (2006.01) |
| *G06F 1/10* | (2006.01) |

(52) U.S. Cl.
CPC .............. *G11C 7/222* (2013.01); *G06F 1/08* (2013.01); *G06F 1/10* (2013.01); *G06F 1/12* (2013.01); *G06F 1/14* (2013.01)

(58) Field of Classification Search
None
See application file for complete search history.

(56) References Cited

U.S. PATENT DOCUMENTS

| | | | | |
|---|---|---|---|---|
| 7,936,857 B2 * | 5/2011 | Hsu | ........................ | H04L 7/0338 375/371 |
| 8,121,240 B1 * | 2/2012 | Dalvi | ....................... | H04L 1/205 375/371 |

FOREIGN PATENT DOCUMENTS

KR  100948067  3/2010

* cited by examiner

*Primary Examiner* — Jeffery S Zweizig
(74) *Attorney, Agent, or Firm* — IP & T Group LLP

(57) ABSTRACT

A clock monitoring circuit includes: a sampling circuit suitable for sampling a monitoring target clock in synchronization with a sampling clock; a first counter circuit suitable for counting the number of times that the sampling circuit samples the monitoring target clock at a predetermined level; and a second counter circuit suitable for counting the number of times that the sampling circuit performs sampling.

19 Claims, 3 Drawing Sheets

CLOCK MONITORING CIRCUIT

CROSS-REFERENCE TO RELATED APPLICATIONS

The present application claims priority under 35 U.S.C. § 119(a) to Korean Patent Application No. 10-2017-0179850, filed on Dec. 26, 2017, which is incorporated herein by reference in its entirety.

BACKGROUND

1. Field

Exemplary embodiments of the present invention generally relate to an integrated circuit technology. Particularly, the embodiments relate to a clock monitoring circuit for monitoring the state of a clock that is used inside an integrated circuit.

2. Description of the Related Art

Generally, an integrated circuit chip such as a central processing unit (CPU) and a memory operates based on a clock. Therefore, it is very important to accurately control the duty of the clock. For example, if the duty of the clock is not exactly 50% in a memory where data is inputted and/or outputted at a rising edge of the clock and a falling edge of the clock, the timing between the rising edge and the falling edge is mismatched so that data may not be inputted or outputted at a correct timing.

Therefore, a clock monitoring circuit for monitoring the state of the clock may be used in diverse integrated circuit chips. Also, circuits for correcting the duty of the clock to 50% based on the monitoring result may be used. In the integrated circuit chips, use positions of clocks may be different, and the states of the clocks may be different according to the positions. Therefore, the clock monitoring circuit may be required to monitor clocks in various positions of the integrated circuit chips. If the complexity and area of the clock monitoring circuit increase, there may be restrictions in using the clock monitoring circuit.

SUMMARY

Embodiments of the present invention are directed to a clock monitoring circuit having a simple structure and capable of monitoring the state of a clock in the inside of an integrated circuit.

In accordance with an embodiment of the present invention, a clock monitoring circuit includes: a sampling circuit suitable for sampling a monitoring target clock in synchronization with a sampling clock; a first counter circuit suitable for counting the number of times that the sampling circuit samples the monitoring target clock at a predetermined level; and a second counter circuit suitable for counting the number of times that the sampling circuit performs sampling.

DETAILED DESCRIPTION

Figure 1:
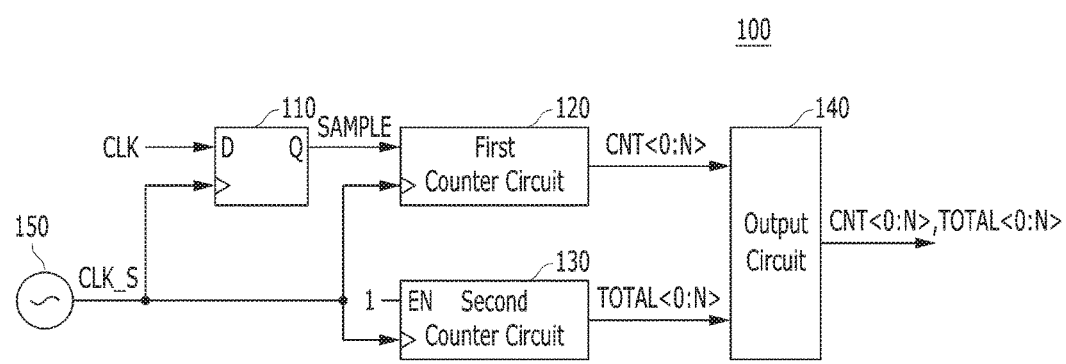
FIG. 1 is a block diagram illustrating a clock monitoring circuit in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention. It is noted that reference to "an embodiment" does not necessarily mean only one embodiment, and different references to "an embodiment" are not necessarily to the same embodiment(s).

FIG. 1 is a block diagram illustrating a clock monitoring circuit 100 in accordance with an embodiment of the present invention.

Referring to FIG. 1, the dock monitoring circuit 100 may include a sampling circuit 110, a first counter circuit 120, a second counter circuit 130, an output circuit 140, and an oscillator 150.

The oscillator 150 may generate a sampling clock CLK_S for sampling a monitoring target clock CLK. In various embodiments, the frequency of the sampling clock CLK_S and the frequency of the monitoring target clock CLK are different from each other in order to obtain an accurate monitoring result of the clock monitoring circuit 100. Also, the frequency ratio between the sampling clock CLK_S and the monitoring target clock CLK may not be an integer ratio. Although it is illustrated in FIG. 1 that the clock monitoring circuit 100 includes the oscillator 150, the clock monitoring circuit 100 may not include the oscillator 150 when there is a clock used as the sampling clock CLK_S in the integrated circuit including the clock monitoring circuit 100.

The sampling circuit 110 may sample the monitoring target clock CLK in synchronization with the sampling clock CLK_S. To be specific, the sampling circuit 110 may sample the logic level of the monitoring target clock CLK at each rising edge of the sampling clock CLK_S. Alternatively, the sampling circuit 110 may sample the logic level of the monitoring target clock CLK at each falling edge of the sampling clock CLK_S. The sampling circuit 110 may be a D flip-flop that receives the sampling clock CLK_S at a clock terminal, receives the monitoring target clock CLK at a D terminal, and outputs a sampling result SAMPLE at a Q terminal.

The first counter circuit 120 may count the number of times that the monitoring target clock CLK is sampled at a predetermined level by the sampling circuit 110. The predetermined level may be one between a logic high level and a logic low level. Herein, it is assumed that the predetermined level is a logic high level. The first counter circuit 120 may use the sampling result SAMPLE as an activation signal. In other words, the first counter circuit 120 may be activated when the sampling result SAMPLE is a logic high level, and inactivated when the sampling result SAMPLE is a logic low level. When the first counter circuit 120 is activated, the first counter circuit 120 may count the number of times that the sampling clock CLK_S is activated. As a result, the first counter circuit 120 may count the number of times that the monitoring target clock CLK is sampled to a logic high level by the sampling circuit 110 to generate a result CNT<0:N> (where N is an integer equal to or greater than 1).

The second counter circuit 130 may count the sampling number of the sampling circuit 110. The second counter circuit 130 may use a signal with a logic high level "1" as an activation signal. In other words, the second counter circuit 130 may maintain the active state continuously. Since the second counter circuit 130 counts the number of times that the sampling clock CLK_S is activated, the second counter circuit 130 may be able to generate a result TOTAL<0:N> after all by counting the sampling number of the sampling circuit 110.

The ratio of the counting result CNT<0:N> of the first counter circuit 120 to the counting result TOTAL<0:N> of the second counter circuit 130 may include information on the duty of the monitoring target clock CLK. As the ratio value between the CNT<0:N> and the TOTAL<0:N> increases, the duty ratio of the monitoring target clock CLK increases. In contrast, as the ratio value between the CNT<0:N> and the TOTAL<0:N> decreases, the duty ratio of the monitoring target clock CLK decreases. The descriptions above will be described in more detail with reference to FIG. 2.

The output circuit 140 may output the monitoring results of the clock monitoring circuit 100 CNT<0:N> and TOTAL<0:N> to the outside of the integrated circuit including the clock monitoring circuit 100. The output circuit 140 may include (2N+2) output drivers (not shown) to output the monitoring result. The monitoring result CNT<0:N> and TOTAL<0:N> of the clock monitoring circuit 100 may be outputted external to the integrated circuit so that the state of the monitoring target clock CLK may be monitored externally. Alternatively, the output circuit 140 may not be needed when the monitoring result is used in the inside of the integrated circuit. Also, it is possible to design the output circuit 140 to output the monitoring results by using a smaller number of output drivers through a parallel-to-serial conversion, instead of outputting the monitoring results in parallel by using the (2N+2) output drivers.

The dock monitoring circuit 100 may monitor the state of the monitoring target dock CLK by using a simple structure such as the sampling circuit 110 and the first and second counter circuits 120 and 130.

Figure 2:
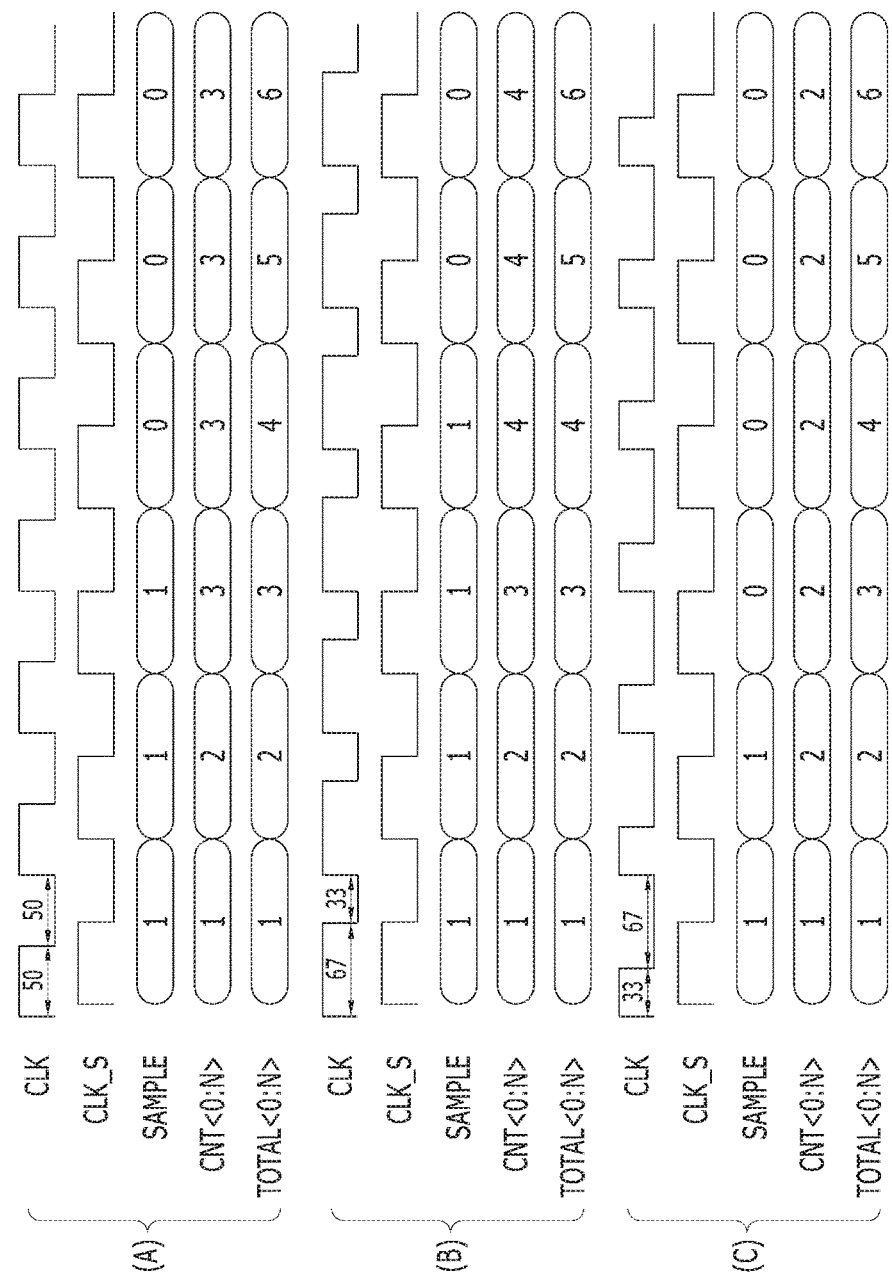
FIG. 2 is a timing diagram illustrating an operation of a clock monitoring circuit in accordance with an embodiment of the present invention.

FIG. 2 is a timing diagram illustrating an operation of a clock monitoring circuit in accordance with an embodiment of the present invention, for example, the clock monitoring circuit 100 shown in FIG. 1.

In the timing diagram of FIG. 2, case (A) shows an operation of the clock monitoring circuit 100 when the duty ratio or cycle of the monitoring target clock CLK is 50%. At a rising edge of the sampling clock CLK_S, the logic level of the monitoring target clock CLK may be sampled to generate the sampling result SAMPLE. The counting result CNT<0:N> of the first counter circuit 120 may be increased at each rising edge of the sampling clock CLK_S only when the sampling result SAMPLE is 1. In contrast, the counting result TOTAL<0:N> of the second counter circuit 130 may be increased at each rising edge of the sampling clock CLK_S. Consequently, the counting result CNT<0:N> of the first counter circuit 120 may become 3, and the counting result TOTAL<0:N> of the second counter circuit 130 may become 6. The ratio of 3:6 may represent that the duty ratio of the monitoring target clock CLK is 50%.

In the timing diagram of FIG. 2, case (B) shows an operation of the clock monitoring circuit 100 when the duty ratio of the monitoring target clock CLK is 67%. The operation of (B) may also operate the same as the operation of (A). Consequently, the counting result CNT<0:N> of the first counter circuit 120 may become 4, and the counting result TOTAL<0:N> of the second counter circuit 130 may become 6. The ratio of 4:6 may represent that the duty ratio of the monitoring target clock CLK is 67%.

In the timing diagram of FIG. 2, case (C) shows an operation of the clock monitoring circuit 100 when the duty ratio of the monitoring target clock CLK is 33%. The operation of (C) may also operate the same as the operation of (A). Consequently, the counting result CNT<0:N> of the first counter circuit 120 may become 2, and the counting result TOTAL<0:N> of the second counter circuit 130 may become 6. The ratio 2:6 may represent that the duty ratio of the monitoring target clock CLK is 33%.

In all cases (A), (B), and (C), the monitoring result may be more accurate as the operating time of the clock monitoring circuit 100 increases.

Figure 3:
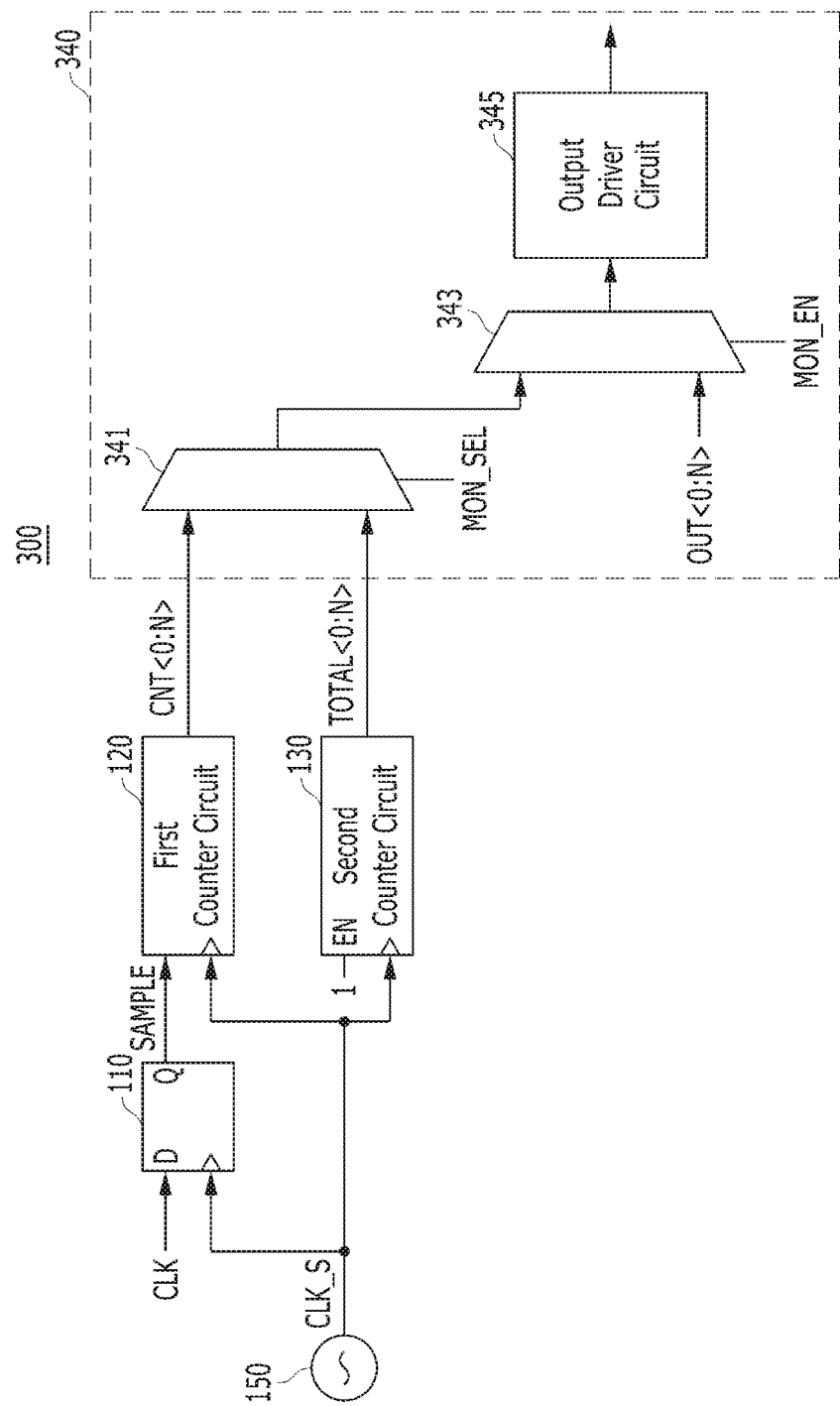
FIG. 3 is a block diagram illustrating a clock monitoring circuit in accordance with an embodiment of the present invention.

FIG. 3 is a block diagram illustrating a clock monitoring circuit 300 in accordance with an embodiment of the present invention.

Referring to FIG. 3, the clock monitoring circuit 300 may include a sampling circuit 110, a first counter circuit 120, a second counter circuit 130, and an oscillator 150, which are the same as those of the clock monitoring circuit 100 shown in FIG. 1. Furthermore, the clock monitoring circuit 300 may include an output circuit 340.

The output circuit 340 may include a first selector 341, a second selector 343, and an output driver circuit 345.

The first selector 341 may select one between the counting result CNT<0:N> of the first counter circuit 120 and the counting result TOTAL<0:N> of the second counter circuit 130 in response to a monitoring selection signal MON_SEL. In a monitoring mode, the monitoring selection signal MON_SEL may transition between a logic high level 1 and a logic low level 0, and after all, the counting result CNT<0:N> and the counting result TOTAL<0:N> may be alternately selected and outputted.

The second selector 343 may select a selection result of the first selector 341 or an output signal OUT<0:N> in response to a monitoring mode signal MON_EN. The output signal OUT<0:N> may be a signal (e.g., data) which is outputted by the integrated circuit including the clock monitoring circuit 300 to the output driver circuit 345 when the mode is not the monitoring mode. The monitoring mode signal MON_EN may be activated in the monitoring mode and may be inactivated otherwise.

The output driver circuit 345 may include (N+1) output drivers, and the output driver circuit 345 may output the signal selected by the second selector 343 to the outside of the integrated circuit by using the (N+1) output drivers.

As a result, the output circuit 340 may alternately output the counting result CNT<0:N> of the first counter circuit 120 and the counting result TOTAL<0:N> of the second counting circuit 130 in the monitoring mode to the outside of the integrated circuit, and output the output signal OUT<0:N> to the outside of the integrated circuit when the mode is not the monitoring mode.

According to the embodiments of the present invention, a clock monitoring circuit with a simple structure may be capable of monitoring the state of a clock in the inside of an integrated circuit.

While the present invention has been described with respect to the specific embodiments, it will be apparent to those skilled in the art that various changes and modifications may be made without departing from the spirit and scope of the invention as defined in the following claims.

What is claimed is:

1. A clock monitoring circuit, comprising:
    a sampling circuit suitable for sampling a monitoring target clock in synchronization with a sampling clock;
    a first counter circuit suitable for counting the number of times that the sampling circuit samples the monitoring target clock at a predetermined level; and
    a second counter circuit suitable for counting the number of times that the sampling circuit performs sampling.

2. The clock monitoring circuit of claim 1, wherein the sampling clock has a frequency that is different from a frequency of the monitoring target clock, and
    a frequency ratio of the sampling clock to the monitoring target clock is not an integer ratio.

3. The clock monitoring circuit of claim 2, further comprising:
    an output circuit suitable for outputting a counting result of the first counter circuit and a counting result of the second counter circuit.

4. The clock monitoring circuit of claim 2, wherein the sampling circuit samples the monitoring target clock at a rising edge of the sampling clock, and
    the second counter circuit counts the number of rising edges of the sampling clock.

5. The clock monitoring circuit of claim 2, wherein the sampling circuit samples the monitoring target clock at a falling edge of the sampling clock, and
    the second counter circuit counts the number of falling edges of the sampling clock.

6. The clock monitoring circuit of claim 2, wherein the predetermined level is one level between a logic high level and a logic low level.

7. The clock monitoring circuit of claim 3, wherein the output circuit includes:
    a first selector suitable for selecting one between the counting result of the first counter circuit and the counting result of the second counter circuit;
    a second selector suitable for selecting one between the counting result selected by the first selector and an output signal; and
    an output driver circuit suitable for outputting the selected one by the second selector.

8. The clock monitoring circuit of claim 7, wherein the first selector alternately selects the counting result of the first counter circuit and the counting result of the second counter circuit in a clock monitoring mode, and
    the second selector selects the counting result that is selected by the first selector in the clock monitoring mode and selects the output signal otherwise.

9. The clock monitoring circuit of claim 2, wherein a ratio of a counting value of the first counter circuit to a counting value of the second counter circuit represents a duty ratio of the monitoring target clock.

10. The clock monitoring circuit of claim 2, further comprising:
    an oscillator suitable for generating the sampling clock.

11. A clock monitoring circuit, comprising:
    a sampling circuit suitable for sampling a monitoring target clock in synchronization with a sampling clock;
    a first counter circuit suitable for counting the number of times that the sampling circuit samples the monitoring target clock at a predetermined level;
    a second counter circuit suitable for counting the number of times that the sampling circuit performs sampling; and
    an output circuit suitable for outputting a counting result of the first counter circuit and a counting result of the second counter circuit.

12. The clock monitoring circuit of claim 11, wherein the sampling clock has a frequency that is different from a frequency of the monitoring target clock, and
    a frequency ratio of the sampling clock to the monitoring target clock is not an integer ratio.

13. The clock monitoring circuit of claim 12, wherein the sampling circuit samples the monitoring target clock at a rising edge of the sampling clock, and
    the second counter circuit counts the number of rising edges of the sampling clock.

14. The clock monitoring circuit of claim 12, wherein the sampling circuit samples the monitoring target clock at a falling edge of the sampling clock, and
    the second counter circuit counts the number of falling edges of the sampling clock.

15. The clock monitoring circuit of claim 12, wherein the predetermined level is one level between a logic high level and a logic low level.

16. The clock monitoring circuit of claim 11, wherein the output circuit includes:
    a first selector suitable for selecting one between the counting result of the first counter circuit and the counting result of the second counter circuit;
    a second selector suitable for selecting one between the counting result selected by the first selector and an output signal; and
    an output driver circuit suitable for outputting the selected one by the second selector.

17. The clock monitoring circuit of claim 16, wherein the first selector alternately selects the counting result of the first counter circuit and the counting result of the second counter circuit in a clock monitoring mode, and
    the second selector selects the counting result that is selected by the first selector in the clock monitoring mode and selects the output signal otherwise.

18. The clock monitoring circuit of claim 12, wherein a ratio of a counting value of the first counter circuit to a counting value of the second counter circuit represents a duty ratio of the monitoring target clock.

19. The clock monitoring circuit of claim 12, further comprising:
    an oscillator suitable for generating the sampling clock.

* * * * *